(12) United States Patent
Chang

(10) Patent No.: US 6,352,901 B1
(45) Date of Patent: Mar. 5, 2002

(54) METHOD OF FABRICATING A BIPOLAR JUNCTION TRANSISTOR USING MULTIPLE SELECTIVELY IMPLANTED COLLECTOR REGIONS

(75) Inventor: Kuan-Lun Chang, Hsinchu (TW)

(73) Assignee: Industrial Technology Research Institute, Hsin-chu (TW)

( * ) Notice: Subject to any disclaimer, the term of this patent is extended or adjusted under 35 U.S.C. 154(b) by 0 days.

(21) Appl. No.: 09/534,164

(22) Filed: Mar. 24, 2000

(51) Int. Cl.[7] ............................................... H01L 21/20
(52) U.S. Cl. ....................... 438/309; 438/320; 438/340; 438/341; 438/350; 438/364; 438/365; 438/371; 438/372
(58) Field of Search ................................. 438/320, 309, 438/340, 341, 350, 364, 365, 371, 372

(56) References Cited

U.S. PATENT DOCUMENTS

| | | | |
|---|---|---|---|
| 4,745,080 A | * 5/1988 | Scovell | 437/31 |
| 4,866,001 A | * 9/1989 | Pickett et al. | 437/32 |
| 5,011,784 A | 4/1991 | Ratnakumar | 437/34 |
| 5,071,778 A | 12/1991 | Solheim | 437/31 |
| 5,117,271 A | * 5/1992 | Comfort et al. | 357/34 |
| 5,183,768 A | 2/1993 | Kameyama et al. | 437/26 |
| 5,336,926 A | 8/1994 | Matthews | 257/657 |

* cited by examiner

Primary Examiner—Robert Kunemund
(74) Attorney, Agent, or Firm—George O. Saile; Stephen B. Ackerman

(57) ABSTRACT

A process for fabricating a bipolar junction transistor, featuring the use of multiple self-aligned collector regions, used to limit the width of the base region of the transistor, has been developed. The self-aligned collector regions are formed via multiple ion implantation procedures, performed through, and self-aligned to, an overlying emitter opening, in an oxide layer. The self-aligned collector regions, completely fill the space in the lighter doped collector region, located between the overlying base region, and the underlying subcollector region.

20 Claims, 3 Drawing Sheets

METHOD OF FABRICATING A BIPOLAR JUNCTION TRANSISTOR USING MULTIPLE SELECTIVELY IMPLANTED COLLECTOR REGIONS

BACKGROUND OF THE INVENTION

(1) Field of the Invention

The present invention relates to processes used to fabricate semiconductor devices, and more specifically to a process used to selectively ion implant multiple collector regions, in an area between a base region, and an underlying subcollector region.

(2) Description of the Prior Art

Bipolar junction transistors feature improved performance, in terms of switching speeds or device frequency, (Ft), compared to metal oxide semiconductor field effect transistors, (MOSFET). The performance of bipolar devices are influenced by many elements, including the base width of the device, as well as junction capacitances. Advances in specific fabrication disciplines, such as ion implantation, has allowed narrow base widths to be realized, thus resulting in a higher Ft, and increased device performance. However to further narrow base widths, a base width "tail", sometimes located at the bottom of the base region, has to minimized. The base width "tail" can add unwanted depth to the base width, at the interface of the base width "tail" and a lightly doped, underlying collector region. The collector region, usually comprised of a lightly doped epitaxial silicon layer, located overlying a heavily doped, buried layer, of the same conductivity type, is maintained at a low dopant concentration level to minimize capacitance at the collector—base junction. Thus performance trade-offs exist, in terms of limiting base width via use increased collector dopant concentration, or limiting capacitance via decreasing the dopant level of the collector region.

This invention will describe a process in which selectively implanted collector, (SIC), regions, with a dopant concentration greater than the dopant concentration in the epitaxial collector region, is used truncate the tail of the base region, limiting the base width, while minimizing the increase in capacitance, at the collector—base junction, resulting from the use of the higher dopant SIC regions. Prior art such as Matthews, in U.S. Pat. No. 5,336,926, describe a bipolar junction transistor, (BJT), in which a SIC type region is formed in the area of the BJT underlying the emitter region, and overlying the lightly doped, epitaxial collector region. This prior art, using only a single SIC region, does limit the tail of the base region, but still leaves a lightly doped, epitaxial collector region, located between overlying SIC region, and the underlying buried collector region. The existence of this lightly doped collector region, featuring high collector resistance, adversely influences BJT performance. This invention will describe a process in which the entire space, between the base region, and the buried collector region, is filled with the higher dopant, SIC regions. This is accomplished via the ion implantation of multiple SIC regions, each obtained at a specific implant energy and dose, to minimize collector resistance, while also minimizing collector—base capacitance. If a single, SIC ion implantation procedure were used to fill the space between the base and buried collector region, the temperature excursions needed to effectively create the SIC region, would result in unwanted lateral spreading of the SIC region, increasing collector—base resistance.

SUMMARY OF THE INVENTION

It is an object of this invention to fabricate a BJT, featuring a narrow base width, and low collector—base capacitance.

It is another object of this invention to create multiple SIC regions, self-aligned to an overlying emitter opening, in an oxide layer, in an area located underlying the base region, and overlying the buried collector region.

It is yet another object of this invention to use specific energies, and specific doses, for the multiple SIC regions, to minimize the lateral spreading of the SIC regions.

In accordance with the present invention a method of fabricating a BJT, using multiple SIC regions, to improve BJT performance, is described. A heavily doped, collector region, is formed on a semiconductor substrate, followed by the growth of an epitaxial silicon layer, exhibiting the same conductivity type, as, but at a lower dopant concentration than, the buried, heavily doped, collector region. After formation of a silicon oxide layer, a base region, of opposite conductivity type than the collector region, is formed in a top portion of the epitaxial collector region. After deposition of an undoped, thin polysilicon layer on the silicon oxide layer, located on the surface of the base region, a thick photoresist shape is used as a mask to form an opening in the thin polysilicon layer, exposing a portion of the silicon oxide layer, overlying the base region. The same photoresist shape is then used as a mask to allow multiple ion implantation procedures to create multiple SIC regions, in the bottom portion of the epitaxial collector region, completely filling the space between the base region, and the buried collector region. After removal of the silicon oxide layer, exposed in the opening in the photoresist shape, followed by the removal of the photoresist shape, a polysilicon emitter structure is formed, interfacing the portion of the top surface of base region, exposed in the silicon oxide opening. An anneal cycle allows dopant from the polysilicon emitter to diffuse into the top portion of the base region, creating the emitter region of the BJT, while also activating the ion implanted species, in the multiple SIC regions, resulting in a BJT device, comprised of a narrow base region, located directly overlying multiple SIC regions.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENT

The process used to fabricate a BJT device, using multiple SIC regions, and the dopant profile obtained using this process, will now be described in detail. This invention is described for an NPN transistor, that is an N type emitter, an N type collector region, and N type SIC regions, while using a P type base region. However this invention can also be used to create PNP, bipolar junction transistors, via use of P type, emitter, collector, and SIC regions, while using an N type base region.

Figure 1:
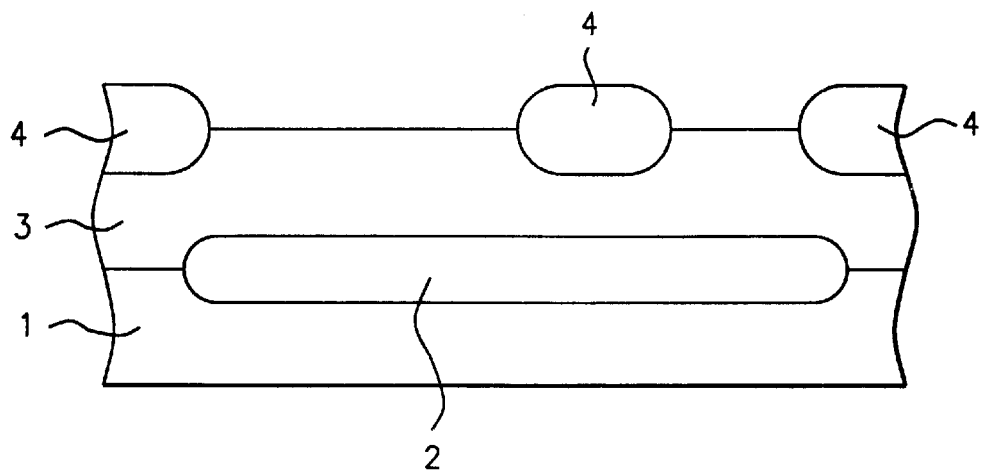
FIGS. 1, 2, 3A, which schematically, in cross-sectional style, describe key stages of fabrication of a BJT device, without the use of the multiple SIC regions, described in this invention.

A P type semiconductor substrate 1, schematically shown in FIG. 1, comprised of single crystalline silicon, with a <100> crystallographic orientation, is used. A heavily doped, N+ region 2, is formed via use of an ion implantation procedure, performed at an energy between about 50 to 100 KeV, and at a dose between about 1E15 to 1E16 atoms/cm$^2$, using arsenic, or antimony as a source, resulting in a surface concentration for heavily doped, N+ region 2, of between about 1E19 to 1E20 atoms/cm$^3$. A photolithographic masking procedure, was used to allow the heavily doped, N+ region 2, to be formed only in the specific locations of semiconductor substrate 1, to be used for the creation of the BJT device. A silicon oxide layer, not shown in the drawings, was used as a screen oxide, for the ion implantation procedure. After removal of the masking photoresist shape, via plasma oxygen ashing, followed by removal of the silicon oxide, screening layer, via a buffered hydrofluoric acid solution, a single crystalline silicon layer 3, is epitaxially grown, to a thickness between about 7000 to 12000 Angstroms, at a temperature between about 700 to 1100° C. Single crystalline silicon layer 3, to be called the lightly doped subcollector region, is grown in a silane or SiH$_2$F$_2$ ambient, with the addition of arsine, or phosphine, to result in a dopant concentration, for lightly doped subcollector 3, between about 1E16 to 2E16 atoms/cm$^3$. The growth of the lightly doped subcollector layer results in some outdiffusion from underlying heavily doped N+ region 2, to now be identified as buried subcollector region 2. This is schematically shown in FIG. 1.

Isolation regions 4, are next formed via a thermal oxidation procedure, in an oxygen—steam ambient, at a temperature between about 900 to 1100° C., to a thickness between about 4500 to 6000 Angstroms. Specific regions of the subsequent BJT device, are masked by an oxidation resistant, composite masking pattern, during the growth of isolation regions 4. The composite masking pattern is comprised of an overlying silicon nitride layer, at a thickness between about 1000 to 1500 Angstroms, on an underlying silicon oxide pad layer, at a thickness between about 250 to 600 Angstroms, both obtained via low pressure chemical vapor deposition, (LPCVD), or plasma enhanced chemical vapor deposition, (PECVD), procedure, and patterned via conventional photolithographic and RIE procedures, using CF$_4$ as an etchant. After growth of isolation regions, or field oxide, (FOX), regions 4, the composite masking pattern is removed via wet procedures, using hot phosphoric acid for removal of the silicon nitride layer, while using a buffered hydrofluoric acid solution for removal of the underlying silicon oxide pad layer. If desired, isolation regions 4, can be insulator filled, shallow trench regions, formed via creation of shallow trenches, in the lightly doped subcollector region, via photolithographic and RIE procedures, Using Cl$_2$ as an etchant, followed by the deposition of an insulator layer, such as silicon oxide layer, via LPCVD or PECVD procedures. Removal of the insulator layer, from the top surface of lightly doped subcollector region 3, via use of a chemical mechanical polishing, (CMP), procedure, or via a selective RIE procedures, results in insulator filled, shallow trench isolation regions.

Figure 2:
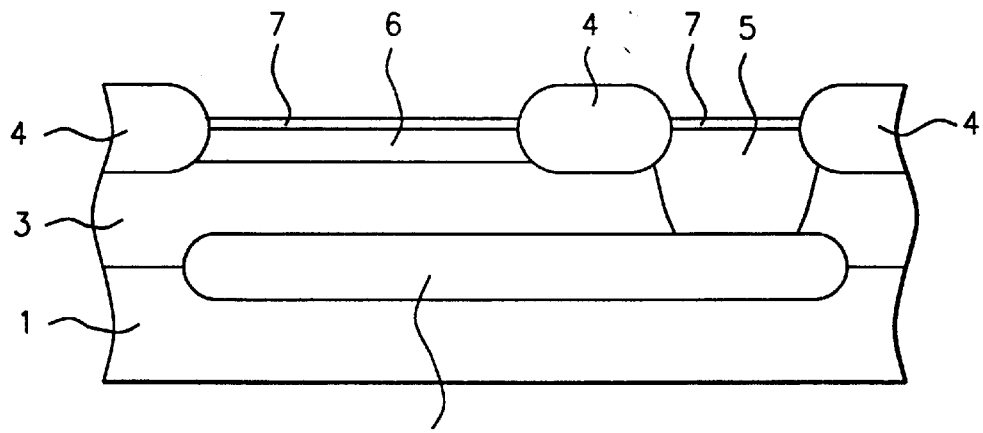

Conventional photolithographic procedures are used to allow a heavily doped, N+ region 5, to be created in lightly doped subcollector region 3, interfacing buried subcollector region 2, in an area between isolation regions 4. Heavily doped, N+ region 5, referred to as an N+ reach through region, is created via ion implantation procedures, at an energy between about 70 to 200 KeV, at a dose between about 1E15 to 1E16 atoms/cm$^2$, using phosphorous ions. After removal of the photoresist shape, used for definition of N+ reach thru region 5, a long-time, high temperature drive-in is then used to push the phosphorous dosage, in N+ region 5, to the N+ region 2. Another photoresist shape is next used for definition of base region 6, schematically shown in FIG. 2. Prior to the formation of the photoresist shape, used for definition of the base region, a silicon dioxide screen oxide layer 7, is thermally grown, to a thickness between about 100 to 300 Angstroms. An ion implantation procedure is next performed, at an energy between about 40 to 80 KeV, at a dose between about 2E13 to 5E13 atoms/cm$^2$, using BF$_2$ ions, creating at P type, base region 6, with a surface concentration between about 1E18 to 5E18 atoms/cm$^3$.

After removal of the photoresist shape, used for definition of base region 6, via plasma oxygen ashing and careful wet cleans, an undoped, thin polysilicon layer 30, is deposited via low pressure chemical vapor deposition, (LPCVD), procedures, at a thickness between about 300 to 500 Angstroms. An emitter opening 25, is created in undoped, thin polysilicon layer 30, via conventional photolithographic and reactive ion etching, (RIE), procedures, using HBr and Cl$_2$ as an etchant, exposing a portion of the top surface of silicon oxide screen oxide layer 7, in a region overlying P type, base region 6. After removal of the photoresist shape, used to define emitter opening 25, again using plasma oxygen ashing and careful wet cleans, a polysilicon layer is deposited via LPCVD procedures, at a thickness between about 2000 to 3500 Angstroms. Prior to the growth of the polysilicon layer, the portion of silicon oxide screen oxide 7, exposed, in emitter opening 25, is removed using a buffered hydrofluoric acid solution. The polysilicon layer can be in situ doped, during deposition, via the addition of arsine, or phosphine, to a silane ambient, or the polysilicon layer can be deposited intrinsically, and doped via an ion implantation procedure, using arsenic ions, at an energy between about 40 to 100 KeV, at a dose between about 1E16 to 2E16 atoms/cm$^2$. Conventional photolithographic and RIE procedures, using Cl$_2$ as an etchant, are used to pattern the polysilicon layer, creating polysilicon emitter structure 8a, schematically shown in FIG. 3A. After removal of the photoresist shape, used to define polysilicon emitter structure 8a, via plasma oxygen ashing and careful wet cleans, a critical anneal procedure, performed at a temperature between about 1000 to 1050° C., for a time between about 5 to 20 sec, in a nitrogen ambient, is used to out diffuse N type dopant, from polysilicon emitter structure 8a, to the exposed portion of P type, base region 6, creating emitter region 8b, in a top portion of P type, base region 6. The bottom portion of P type, base region 6, now located between emitter region 8b, and lightly doped subcollector region 3, is referred to as the base width region 9, of the BJT device, with a concentration at the emitter—base junction of between about 1E18 to 5E18 atoms/cm$^3$, and at a concentration at the base—collector junction of between about 1E16 to 2E16 atoms/cm$^3$.

Figure 3A:
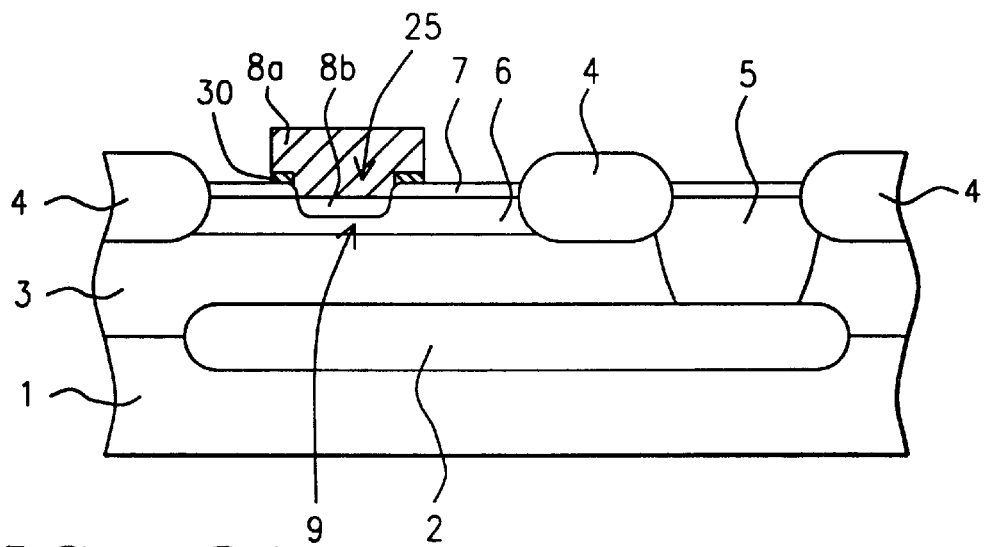
Figure 3B:
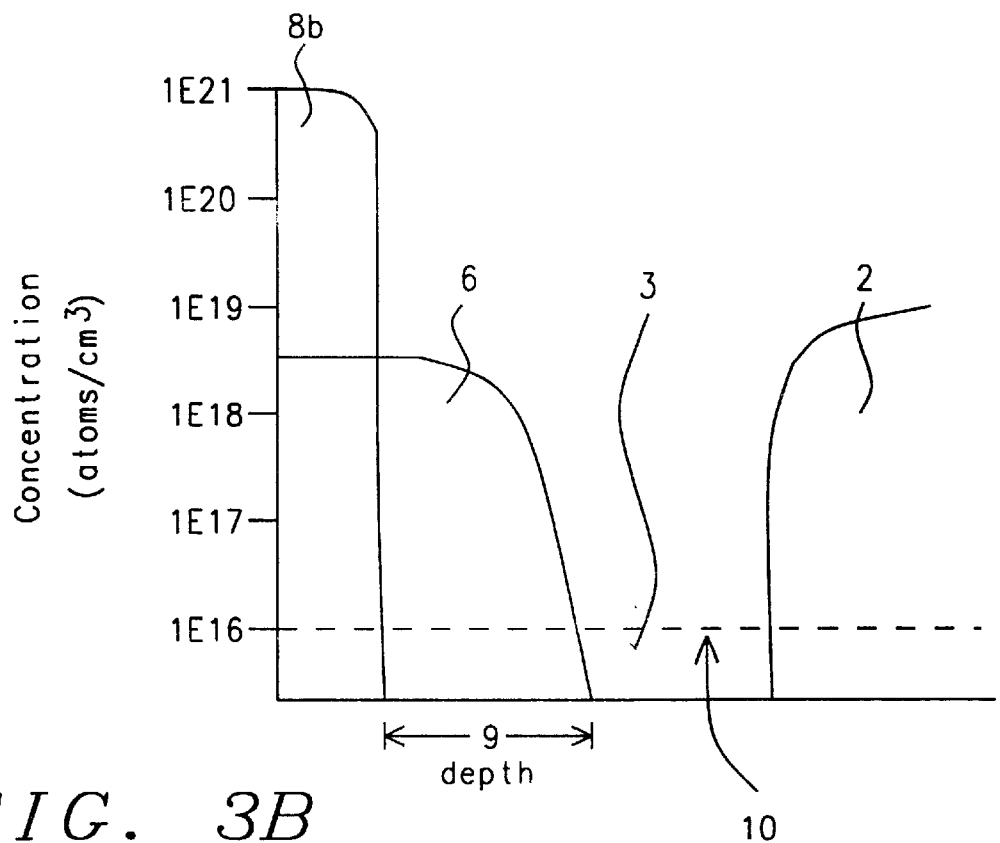
FIG. 3B, which shows the dopant profile of a BJT device, fabricated without the use of the SIC regions.

FIG. 3B, shows the relationship between the concentration, and depth, of the various elements of the BJT device. The switching speed, or performance of a BJT device, is directly related to the base width of the BJT device, the narrower the base width, the greater the performance of the bipolar device. The base width region 9, can be wider than desired due to the low surface concentration of lightly doped subcollector region 3, about 1 to 2E16 atoms/cm$^3$, resulting in the undesirable base width "tail". However if the concentration of lightly doped subcollector region 3, were increased, to truncate the base width region, or to reduce the tail of the base width region, the capacitance at the base—subcollector interface would increase, adversely influencing performance, and thus negating the performance increased achieved by truncating the base width region. In addition space 10, located in lightly doped subcollector region 3, between width region 9, and buried subcollector region 2, should be minimized to minimize performance degrading collector resistance.

Figure 4:
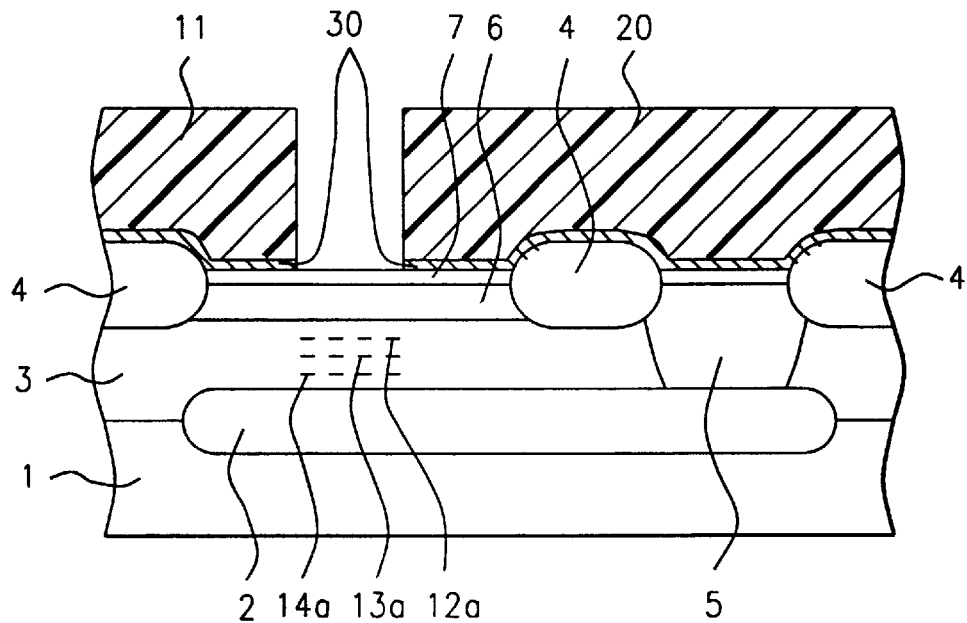
FIGS. 4, 5A, which schematically, in cross-sectional style, describe the key stages of fabrication of a BJT device, fabricated using the multiple SIC regions, described in this invention.

A method to improve BJT device performance, via reducing the base width tail, and via lowering collector resistance, without increasing the collector—base capacitance, will now be described. Undoped, thin polysilicon layer 30, at a thickness between about 300 to 500 Angstroms, and silicon dioxide screen oxide 7, reside on P type, base region 6. Referring to FIG. 4, a thick photoresist shape 20, at a thickness between about 10000 to 20000 Angstroms, with an opening exposing a portion of undoped, thin polysilicon layer 30, is formed. A series of high energy, ion implantation procedures, are used to selectively place N type ions, in the region of lightly doped subcollector region 3, located between P type, base region 6, and buried subcollector region 2. The first ion implantation procedure is performed at an energy between about 200 to 400 KeV, at a dose between about 5E12 to 2E13 atoms/cm$^2$, using phosphorous ions, resulting in self-aligned collector, (SIC), region 12a, schematically shown in FIG. 4. A second ion implantation procedure, performed at an energy between about 300 to 600 KeV, and at a dose between about 5E12 to 2E13 atoms/cm$^2$, again using phosphorous ions, creates SIC region 13a, while a third in implantation procedure, again using phosphorous ions, at an energy between about 500 to 800 KeV, at a dose between about 5E12 to 2E13 atoms/cm$^2$, results in the creation of SIC region 14a. If the space between P type, base region 6, and buried subcollector region 2, is small, the number of SIC regions can be reduced to two, while four or more SIC regions, can be created to fill wider spaces, located between the base and collector regions.

Figure 5A:
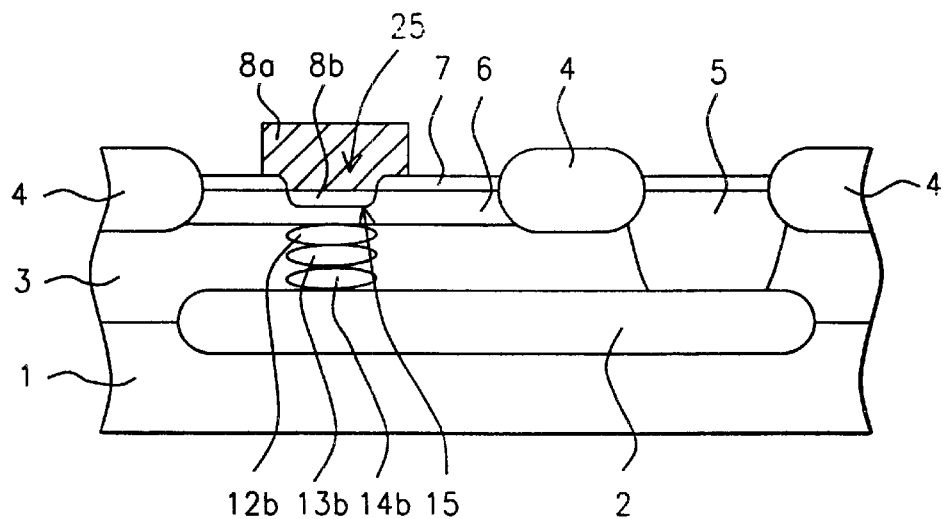

Prior to removal of the portion of photoresist shape 20, via plasma oxygen ashing and careful wet cleans, the region of undoped, thin polysilicon layer 30, exposed in the opening in photoresist shape 20, is removed via RIE procedures, using Cl$_2$ as an etchant. This is followed by the removal of photoresist shape 20, via plasma oxygen ashing and careful wet cleans. The remaining undoped, thin polysilicon shape, is then used as a hard mask to etch silicon oxide screen oxide 7, via a buffered hydrofluoric acid solution, creating emitter opening 25. Another buffered hydrofluoric acid procedure is then used as a pre-deposition step, followed by the deposition of a polysilicon layer, via LPCVD procedures, to a thickness between about 2000 to 3500 Angstroms. The polysilicon layer is again either doped, in situ during deposition, via the addition of arsine to a silane ambient, or deposited intrinsically and doped via an ion implantation procedure, using arsenic ions. Conventional photolithographic and RIE procedures, identical to the procedures previously described for FIG. 3A, are used to create polysilicon emitter structure 8a, schematically shown in FIG. 5A. The emitter RIE procedure defines polysilicon emitter structure 8a, via definition of the previously deposited polysilicon layer, at a thickness between about 2000 to 3500 Angstroms, as well as via definition of undoped, thin polysilicon layer 30. The width of polysilicon emitter structure 8a, is greater than the width of emitter opening 25, allowing polysilicon emitter structure 8a, to completely cover, or overlay, emitter opening 25. The photoresist shape, used for definition of polysilicon emitter structure 8a, is removed via plasma oxygen ashing and careful wet cleans. A critical anneal, is next performed in a nitrogen ambient, at a temperature between about 1000 to 1050° C., for a time between about 5 to 20 sec. The anneal procedure allows dopant from polysilicon emitter structure 8a, to diffuse into P type, base region 6, creating emitter region 8b, while also allowing activation of the dopant ions in SIC regions 12a, 13a, and 14a, to be realized, resulting in SIC regions 12b, 13b, and 14b, schematically shown in FIG. 5A.

Figure 5B:
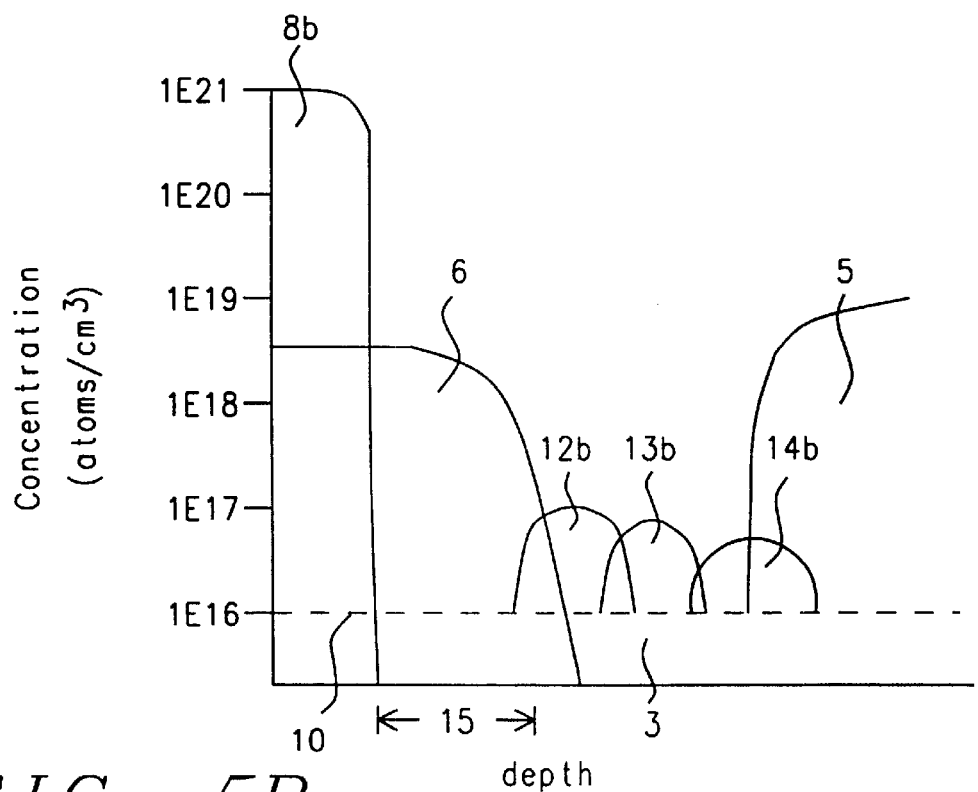
FIG. 5B, which represents the dopant profile of the BJT device, fabricated using the multiple SIC regions, described in this invention.

The concentration profile, for the BJT device, schematically shown in FIG. 5B, shows base width region 15, now truncated by SIC region 12b, narrower in width than base width region 9, previously shown in FIG. 3B, with a concentration at the base—collector junction, now between about 1 to 2E17 atoms/cm$^3$. This is accomplished by forming base width region 15, between emitter region 8b, and the higher doping level of SIC region 12b. Previously base width region 9, was formed wider, as a result of interfacing the lower doped, lightly doped subcollector region 3, which interfaced base width region 9. The use of selectively placing SIC regions, only directly under emitter regions, minimizes the increase in collector—base capacitance, when compared to other designs in which a higher doped, N type, epitaxial silicon layer, used for lightly doped subcollector region 3, is employed. Finally the use of multiple SIC regions, allows the entire space between the base region and the buried subcollector, to be filled with the higher doped SIC regions, thus reducing collector resistance, when compared to counterparts, in which this space was not completely or adequately filled. For example if only one SIC region were formed, the anneal procedure needed to distribute the SIC dopants throughout the space between the base and buried subcollector regions would result in lateral, as well as vertical diffusion, thus increasing the lateral dimension of the SIC area, and thus adversely influencing BJT performance as a result of the unwanted increase in collector—base capacitance.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a bipolar junction transistor, (BJT), on a semiconductor substrate, comprising the steps of:

forming a first conductive region, in said semiconductor substrate, comprised of a first conductivity type, with said first conductive region used as a buried subcollector for said BJT;

growing a second conductive region, on said first conductive region, comprised with said first conductivity type, and used as a collector region for said BJT, and with said second conductive region having a lower dopant concentration than said first conductive region;

growing a thin insulator layer on the top surface of said second conductive region;

forming a third conductive region, in said second conductive region, comprised with a second conductivity type, used as a base region, for said BJT, and leaving a bottom portion of said second conductive region still remaining between overlying said third conductive region, and underlying, said first conductive region;

depositing an undoped, thin polysilicon layer;

forming a photoresist shape, with an opening in said photoresist shape, exposing a portion of the top surface of said undoped, thin polysilicon layer;

performing multiple ion implantation procedures through said opening, in said photoresist shape, into said bottom portion of said second conductive region, located between overlying, said third conductive region, and underlying said first conductive region, forming a fourth conductive region, used as self-aligned collector, (SIC), regions, with said fourth conductive region completely filling said bottom portion of said second conductive region, and comprised of said first conductivity type, and with said fourth conductive region having a dopant concentration greater than the dopant concentration of said second conductive region, but less than the dopant concentration of said first conductive region;

removing the portion of said undoped, thin polysilicon layer, exposed in said opening, in said photoresist shape;

removing the portion of said thin insulator layer, exposed in opening in said undoped, thin polysilicon layer, creating an insulator opening, which exposes a portion of the top surface of said third conductive region;

depositing a polysilicon layer, comprised with a dopant of said first conductivity type;

patterning of said polysilicon layer, and of said undoped, thin polysilicon layer, to form a polysilicon structure, completely filling said insulator opening, and with said polysilicon structure comprised with said first conductivity type; and performing an anneal cycle, to create a fifth conductive region, to be used as the emitter region of said BJT, with said fifth conductive region comprised of said first conductivity type, and located in a top portion of said third conductive region, and having a dopant concentration greater than the dopant concentration of said third conductive region, and greater than the dopant concentration of said fourth conductive region, and resulting in a bottom portion of said third conductive type, used as the base width of said BJT, remaining between overlying, said fifth conductive region, and underlying, said fourth conductive region.

2. The method of claim 1, wherein said first conductive region, used as said subcollector of said BJT, with a surface concentration between about 1E19 to 5E20 atoms/cm$^3$, is formed via an ion implantation procedure, using arsenic, or antimony ions, at an energy between about 50 to 100 KeV, at a dose between about 1E15 to 1E16 atoms/cm$^2$.

3. The method of claim 1, wherein said second conductive region, used as said collector region of said BJT, with a surface concentration between about 1 to 2E16 atoms/cm$^3$, is obtained via epitaxial deposition of a single crystalline silicon layer, at a temperature between about 700 to 1100° C., to a thickness between about 7000 to 12000 Angstroms, and doped via the addition of arsine, or phosphine, to a silane ambient.

4. The method of claim 1, wherein said third conductive region, used as said base region of said BJT, with a surface concentration between about 1E18 to 5E18 atoms/cm$^3$, is created via ion implantation of $BF_2$ ions, at an energy between about 40 to 80 KeV, and at a dose between about 2E13 to 5E13 atoms/cm$^2$.

5. The method of claim 1, wherein said thin insulator layer, is a silicon oxide layer, obtained via thermal oxidation procedures, at a thickness between about 100 to 300 Angstroms.

6. The method of claim 1, wherein between about two or more, ion implantation procedures are used to create said fourth conductive region, performed using phosphorous ions, creating two or more SIC regions, with the ion implantation procedures performed at energies between about 200 to 800 KeV, using doses between about 5E12 to 2E13 atoms/cm$^3$, and with said SIC regions having surface concentrations between about 5E16 to 5E17 atoms/cm$^3$.

7. The method of claim 1, wherein said anneal cycle, used to create said fifth conductive region, in the top portion of said third conductive region, is performed at a temperature between about 1000 to 1050° C., for a time between about 5 to 20 sec., in a nitrogen ambient.

8. The method of claim 1, wherein said fifth conductive region, used as said emitter region of said BJT, is comprised with a surface concentration between about 1E20 to 2E21 atoms/cm$^3$, obtained via diffusion of arsenic from overlying, said polysilicon emitter structure.

9. The method of claim 1, wherein said bottom portion of said third conductive region, used as said base width of said BJT, located between overlying, said fifth conductive region, and underlying, said fourth conductive region, is comprised with a surface concentration between about 1 to 2E17 atoms/cm$^3$, at the base—collector junction.

10. A method of fabricating a bipolar junction transistor, (BJT), on a semiconductor substrate, featuring multiple self-aligned collector, (SIC), regions, created via use of multiple ion implantation procedures, and used to completely fill the collector region, located between the base region and the subcollector region of the BJT, comprising the steps of:

providing a heavily doped, N type, subcollector region, in said semiconductor substrate;

epitaxially growing an N type, collector region, on said heavily doped, N type, subcollector region;

forming a silicon oxide layer on the top surface of said N type,collector region;

forming a P type base region, in a top portion of said N type, collector region, while leaving a bottom portion of said N type, collector region, remaining between overlying, said P type base region, and underlying, said heavily doped, N type subcollector region;

depositing an undoped, thin polysilicon layer;

forming a thick photoresist shape, on said undoped, thin polysilicon layer, with an opening in said photoresist shape, exposing a portion of the top surface of said undoped, thin polysilicon layer;

performing said multiple ion implantation procedures into a region of said semiconductor substrate, not protected by said thick photoresist layer, creating said multiple SIC regions, in said bottom portion of said N type, collector region, with the surface concentration of said multiple SIC regions, higher than the surface concentration of said N type, collector region;

removing the portion of said undoped, thin polysilicon layer, exposed in said opening, in said thick photoresist shape, establishing an emitter opening, in said undoped, thin polysilicon layer, exposing a portion of the top surface of said silicon oxide layer;

removing said photoresist shape;

removing the portion of said silicon oxide layer exposed in said emitter opening, exposing a portion of the top surface of said P type base region;

performing a buffered hydrofluoric acid clean, on portion of said P type, base region, exposed in said emitter opening;

depositing an N type, polysilicon layer;

patterning of said N type, polysilicon layer, and of said undoped, thin polysilicon layer to form an N type, doped polysilicon emitter structure, completely filling said emitter opening; and performing an anneal cycle to create an N type, emitter region, in the top portion of said P type, base region, and creating a P type base width, in said bottom portion of said P type, base region, with said P type base width located between overlying, said N type, emitter region, and underlying, said bottom portion of said N type, collector region, wherein said bottom portion of said N type, collector region is completely filled with said multiple SIC regions.

11. The method of claim 10, wherein said heavily doped, N type, subcollector region, with a surface concentration between about 1E19 to 5E20 atoms/cm$^3$, is formed via ion implantation procedures, using arsenic, or antimony as a source, at an energy between about 50 to 100 KeV, and at a dose between about 1E15 to 1E16 atoms/cm$^2$.

12. The method of claim 10, wherein said N type, collector region, is a single crystalline silicon layer, epitaxially grown, at a temperature between about 700 to 1100° C., to a thickness between about 7000 to 12000 Angstroms, and doped via the addition of arsine, or phosphine, to a silane ambient, resulting in a surface concentration, for said N type, collector region, of between about 1 to 2E16 atoms/cm$^3$.

13. The method of claim 10, wherein said P type, base region, with a surface concentration between about 1E18 to 5E18 atoms/cm$^3$, is obtained via an ion implantation procedure, using BF$_2$ ions, at an energy between about 40 to 80 KeV, and at a dose between about 2E13 to 5E13 atoms/cm$^2$.

14. The method of claim 10, wherein said silicon oxide layer, is obtained via thermal oxidation procedures, at a thickness between about 100 to 300 Angstroms.

15. The method of claim 10, wherein said thick photoresist shape is between about 10000 to 20000 Angstroms, in thickness.

16. The method of claim 10, wherein said multiple ion implantation procedures are performed using phosphorous ions: with a first ion implantation procedure performed at an energy between about 200 to 400 KeV, at a dose between about 5E12 to 2E13 atoms/cm$^2$; a second ion implantation procedure performed at an energy between about 300 to 600 KeV, at a dose between about 5E12 to 2E13 atoms/cm$^2$; and a third ion implantation procedure, performed at an energy between about 500 to 800 KeV, at a dose between about 5E12 to 2E13 atoms/cm$^2$.

17. The method of claim 10, wherein said multiple SIC regions, have a surface concentration between about 5E16 to 5E17 atoms/cm$^3$.

18. The method of claim 10, wherein said N type, polysilicon emitter structure is formed from an N type polysilicon layer, obtained via LPCVD procedures, at a thickness between about 2000 to 3500 Angstroms, and either doped in situ, during deposition, or deposited intrinsically, then doped via an ion implantation procedure, using arsenic ions.

19. The method of claim 10, wherein said anneal procedure, used to create said N type, emitter region, is performed at a temperature between about 1000 to 1050° C., for a time between about 5 to 20 sec., in a nitrogen ambient.

20. The method of claim 10, wherein the surface concentration, at the base—collector junction, wherein said SIC regions comprise the collector region, is between about 1 to 2E17 atoms/cm$^3$.

* * * * *